United States Patent [19]

Haeffele

[11] Patent Number: 5,255,227
[45] Date of Patent: Oct. 19, 1993

[54] SWITCHED ROW/COLUMN MEMORY REDUNDANCY

[75] Inventor: Jeffrey J. Haeffele, Monument, Colo.

[73] Assignee: Hewlett-Packard Company, Palo Alto, Calif.

[21] Appl. No.: 651,681

[22] Filed: Feb. 6, 1991

[51] Int. Cl.$^5$ .......................... G11C 19/28; G11C 8/00
[52] U.S. Cl. .................... 365/200; 365/201; 365/189.12; 371/21.1
[58] Field of Search .................. 365/189.12, 201, 200, 365/203; 371/21

[56] References Cited

U.S. PATENT DOCUMENTS

| | | |
|---|---|---|
| 3,654,610 | 4/1972 | Sander et al. . |
| 3,772,652 | 11/1973 | Hilberg ........................ 365/200 |
| 3,913,072 | 10/1975 | Catt ............................. 365/200 |
| 3,940,740 | 2/1976 | Coontz . |
| 4,463,450 | 7/1984 | Haeusele ..................... 365/200 |
| 4,691,300 | 9/1987 | Pelley, III et al. ........... 365/200 |
| 4,691,301 | 9/1987 | Anderson . |
| 4,754,434 | 6/1988 | Wang et al. . |
| 4,757,503 | 7/1988 | Hayes et al. ................. 371/21 |
| 4,768,193 | 8/1988 | Takemae . |
| 4,951,253 | 8/1990 | Sahara et al. . |
| 5,025,418 | 6/1991 | Asoh ............................ 365/200 |
| 5,117,388 | 5/1992 | Nakano et al. .............. 365/189.12 |
| 5,163,023 | 11/1992 | Ferris et al. ................. 365/200 |

FOREIGN PATENT DOCUMENTS 52-31624 3/1977 Japan .
2183374 6/1987 United Kingdom .

Primary Examiner—Eugene R. LaRoche
Assistant Examiner—Viet Q. Nguyen

[57] ABSTRACT

A plurality of redundant rows/columns are added to a semiconductor memory array wherein each redundant row/column is located at a predetermined location in the memory array so as to divide the memory into equal sectors. Switches are utilized to connect the memory columns and rows and redundant memory columns and rows to row select, write circuitry, and read circuitry so that in the presence of a defective row or column, switches can be activated to remove the defective row or column from the array and to interconnect the remaining rows and columns in a predetermined adjacent pattern of interconnection. The controls for the switches comprise shift registers which are fully programmable and reprogrammable so that even though the memory array is configured to remove defective rows or columns at the point of manufacture, in the event of future defects occurring in the field, the shift registers can be reprogrammed to avoid future defective rows or columns.

11 Claims, 4 Drawing Sheets

SWITCHED ROW/COLUMN MEMORY REDUNDANCY

BACKGROUND OF THE INVENTION

1. Field of the Invention

The present invention relates to semiconductor memories and, more particularly, to semiconductor memories having redundant rows and/or columns used to increase yield rates in the manufacture and use of semiconductor memories.

2. Statement of the Problem

A problem exists in manufacturing semiconductor memories in that certain rows or columns in the semiconductor memory may contain defective memory cells. A need exists for a redundancy design to provide redundant rows and columns in order to increase the manufacturing yield of such semiconductor memories in order to lower the overall cost of manufacturing such memory devices. Hence, upon completion of manufacturing, the memory chip is tested for such defects and in the presence of such defects, the defective columns and rows are avoided and redundant columns and rows are utilized. A number of conventional approaches are available for providing such column and row redundancy in the manufacture of semiconductor memories.

Semiconductor memories can also fail in the field at, for example, a customer's location. A further need, therefore, exists to test the semiconductor memory in the field without the use of field personnel or special equipment. In the presence of such field failures, the redundant memory rows and columns should be configured in to correct for such memory field errors.

A final combined need exists to provide programmable steering logic to control the routing of signals from defective rows/columns into the good, redundant rows/columns not only at the point of manufacturing, but also upon each system start-up even though already configured when manufactured.

3. Results of the Patentability Search

A patentability search directed to the above problem was conducted with the following patents being uncovered:

| PAT. NO. | INVENTOR | ISSUE DATE |
| --- | --- | --- |
| 3,654,610 | Sander et al. | Apr. 4, 1972 |
| 3,940,740 | Coontz | Feb. 24, 1976 |
| 4,691,301 | Anderson | Sep. 1, 1987 |
| 4,754,434 | Wang et al. | Jun. 28, 1988 |
| 4,768,193 | Takemae | Aug. 30, 1988 |
| 4,951,253 | Sahara et al. | Aug. 21, 1990 |

U.S. Pat. No. 4,951,253 sets forth a semiconductor memory system having a redundant column used for replacing defective column. The '253 approach provides a redundant column specifically designed for use for semiconductor memory systems of the serial column access type. The '253 approach requires an address counter for monitoring the address data, a defective address detection circuit for detecting a defective address, and a redundant column selection circuit for selecting the redundant column at the time of a defective address. The redundant data selection circuit switches the data line connecting the data input/output drive circuit from the regular data lines to the redundant data lines. For operation, internal fuses are selectively blown off, at the point of manufacture, for the defective columns. The blowing of the fuse provides the necessary signal potential to program for the redundancy. Hence, the '253 approach requires a blown fuse to generate the address of a defective column in order to select the redundant column and, hence, this approach requires special equipment and is not suitable for "in the field" failures of the memory.

U.S. Pat. No. 3,654,610 sets forth a memory system including at least one redundant row of storage cells and at least one redundant column of storage cells. A code converter is embodied for converting the binary addresses of each of the rows and columns of the memory to combinatorial addresses. Additional combinatorial addresses are associated with the defective rows or columns. The '610 approach requires re-routing of wires to eliminate the bad lines and to substitute for the good lines or by providing proper logic in the necessary code converter circuit. Again, the '610 approach is designed for the manufacturing of semiconductor memories and is not adaptable for "field failures."

U.S. Pat. No. 4,768,193 pertains to a semiconductor memory device having error correction and incorporating a redundancy configuration. The '193 patent also requires the use of inhibit circuits or fuses which are selectively blown when a defective row or column is detected at the point of manufacture. In one embodiment, the inhibit circuit comprises switch circuits for receiving signals so that when the signal received is high (corresponding to a defective cell) the corresponding switch is shut off so that the data read from the defective cell is forcibly made "0."

U.S. Pat. No. 4,754,434 sets forth an apparatus for selecting redundant rows of memory cells wherein the addressing of a defective row of memory cells coupled to a first set of bit lines results in the selection of a redundant row of memory cells coupled to a second set of bit lines. The '434 approach utilizes an indirect fusing technique. The fuses are selectively blown based upon bit lines.

U.S. Pat. No. 4,691,301 also sets forth a semiconductor memory with redundant column circuitry. The '301 patent utilizes a fuse which is selectively blown at manufacturing to activate a single pole double throw switch which permits switching of the defective column out of the memory. The switch interconnects the adjacent good column in substitution for the defective column and all of the other adjacent columns are pushed over so that the last column is pushed over onto the redundant column.

U.S. Pat. No. 3,940,740 pertains to a fabricating process for increasing the yield of a micro electronic memory device by providing additional rows and columns. The '740 process tests the memory at the point of manufacture and electrically alters the memory configuration to by-pass defects. The '740 patent utilizes a series of fusible links to accomplish this.

All of the above prior art approaches uncovered in the patentability search provide redundant columns or rows or both in order to increase the manufacturing yield of semiconductor memories. None of the above approaches are suitable for "in field" detection of defective row/columns or for reconfiguration in the field since special equipment is required to "blow" the fusible links. Hence, a need exists for a circuit arrangement which utilizes redundant rows and columns that does not require physical permanent alterations such as by "blowing" fuses. Rather, a need exists to provide column and row redundancy that is easily programmed at the point of manufacturing, at the point of use in the field and with the ability to continually test the memory for new defects and to then reconfigure the memory even though priorly reconfigured around old defects. Furthermore, the circuitry for providing the redundancy should be also simple in design so as not to interfere with the speed and processing capabilities of the semiconductor memory.

Of the patents uncovered in the patentability search, the '740 and the '301 patents are most pertinent to the teachings of the present invention. The '740 patent provides a redundancy scheme for a global redundant row and/or column in the memory array. This redundant row/column can be enabled in lieu of the defective row/column. The disadvantage of the '740 technique is that the defective row/column is actually shifted to the global redundant row/column thereby encountering a performance problem.

The '301 patent unlike the '740 patent shifts the row/column control around the defective row/column by pushing columns adjacent the defective column to the redundant column. The '301 approach requires the blowing of a fuse to activate the switch in order to perform the pushing. A need exists to eliminate the requirement of a fuse and to make the redundant row/column selection and reconfiguration fully programmable so as to be utilized in the field upon, for example, system start-up.

4. Solution to the Problem

The present invention provides a solution to the above problem by providing a fully programmable switched row/column memory redundancy circuit for semiconductor memories. The redundancy circuit of the present invention can be programmed either at the point of manufacture or subsequently in the field so as to continually test and reconfigure the memory array to avoid defective rows or columns through use of redundant rows or columns. Unlike prior approaches, the present invention is fully digital and does not require blowing fuses to enable the redundancy reconfiguration. Indeed, once configured, to overcome a current defect, the redundancy circuit of the present invention can be subsequently reconfigured in the event that a future defect occurs. Additionally, the present invention orients the switches in a given direction so that unlike the approach in the '301 patent, additional decode circuitry is not required. This results in a simple redundancy circuit without the need for complex combinatorial logic or decode circuits and in the ability to provide reprogrammability to correct for future field failures in addition to manufacturing defects.

SUMMARY OF THE INVENTION

A plurality of redundant rows/columns are added to a semiconductor memory array wherein each redundant row/column is located at a predetermined location in the memory array so as to divide the memory into equal sectors. Switches are utilized to connect the memory columns and rows and redundant memory columns and rows to row select, write circuitry, and read circuitry so that in the presence of a defective row or column, switches can be activated to remove the defective row or column from the array and to interconnect the remaining rows and columns in a predetermined adjacent pattern of interconnection.

The controls for the switches comprise shift registers which are fully programmable and reprogrammable so that even though the memory array is configured to remove defective rows or columns at the point of manufacture, in the event of future defects occurring in the field, the shift registers can be reprogrammed to avoid future defective rows or columns.

DETAILED SPECIFICATION

Figure 1:
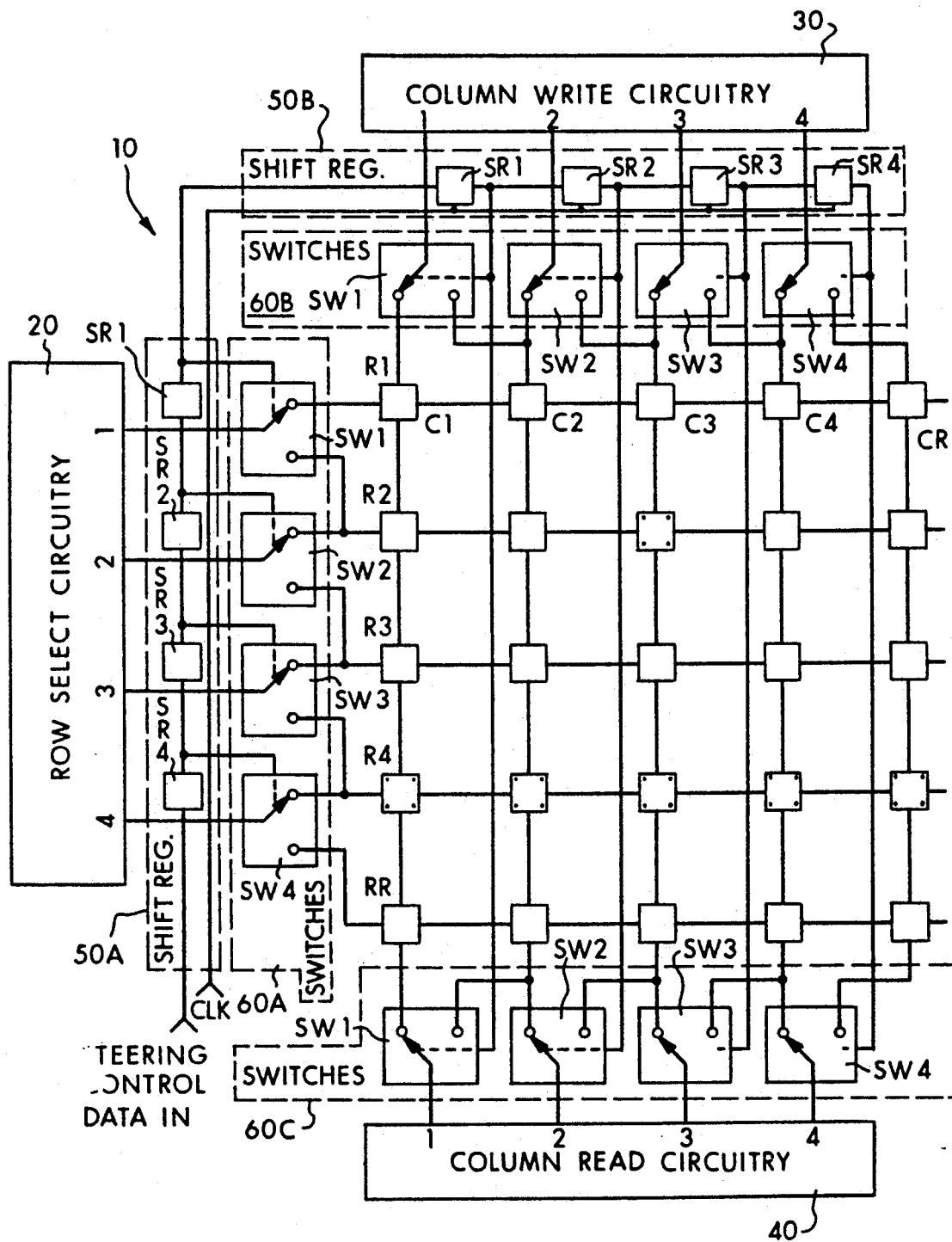
FIG. 1 is a block diagram setting forth the components of the row/column redundancy circuitry of the present invention interfaced in a conventional memory array.

In FIG. 1, a semiconductor memory array 10 comprised of columns C1, C2, C3, C4 and rows R1, R2 R3, and R4 is set forth. Additionally, a redundant column CR and a redundant row RR is set forth. It is to be expressly understood that any number of columns $C_n$ and any number of rows $R_j$ could be utilized. It is also to be expressly understood that any number of redundant columns $CR_i$ and rows $RR_k$ could also be utilized. Furthermore, it is to be understood that the memory array 10 could be constructed into memory sectors so that the redundant columns and rows could be spaced throughout the memory array such as:

|    | C1 | C2 | C3 | C4 | RR$_1$ | C5 | C6 | C7 | C8 | RR$_2$ | C9 | ... |
|----|----|----|----|----|--------|----|----|----|----|--------|----|-----|
| R1 |    |    |    |    | X      |    |    |    |    | X      |    |     |
| R2 |    |    |    |    | X      |    |    |    |    | X      |    |     |
| R3 |    |    |    |    | X      |    |    |    |    | X      |    |     |
| R4 |    |    |    |    | X      |    |    |    |    | X      |    |     |
| RR$_1$ | X | X | X | X | X | X | X | X | X | X | X | ... |
| R5 |    |    |    |    | X      |    |    |    |    | X      |    |     |
| R6 |    |    |    |    | X      |    |    |    |    | X      |    |     |
| R7 |    |    |    |    | X      |    |    |    |    | X      |    |     |
| R8 |    |    |    |    | X      |    |    |    |    | X      |    |     |
| RR$_2$ | X | X | X | X | X | X | X | X | X | X | X | ... |
| R9 |    |    |    |    | X      |    |    |    |    | X      |    |     |

This corresponds to the creation of memory banks in the '301 patent discussed above.

FIG. 1 illustrates a "4 row/1 redundant row, 4 column/1 redundant column configuration." Under the teachings of the present invention, any number of rows/columns for each redundant row/column could be utilized. For example: "7 rows/1 redundant row" or "8 columns/1 redundant column" or "15 rows/1 redundant row 7 columns/1 redundant column." In the preferred embodiment the memory is a 64 Kbit memory with only redundant columns provided. In this embodiment there are 256 rows by 256 columns and a redundant column is provided after every 16th column. Hence, a total of 16 redundant columns are provided.

In FIG. 1 the row select circuitry 20 selectively addresses a row in the memory array 10. The column write circuitry 30 writes data into selected column locations at the selected row. Column read circuitry 40 selectively reads data from the columns at a selected row. It is to be expressly understood that the operations of the row select circuitry 20, the column write circuitry 30, and the column read circuitry 40 are conventional and well known in the art. The present invention adds the redundant column CR and/or the redundant row RR to the memory array 10. It is to be expressly understood that in some configurations, only redundant columns $CR_i$ or redundant rows $RR_k$ may be utilized. Additionally, shift registers 50a and 50b as well as solid state switches 60a and 60b and 60c are utilized under the teachings of the present invention.

In FIG. 1, the 4 row by 4 column memory array 10 has no defects in any column or row. Hence, all of the switches 60a, 60b, and 60c are normally set as shown so that the output lines 1 through 4 of the row select circuitry access the assigned rows R1 through R4 and the output lines 1 through 4 of the column read and write circuitry access the assigned columns C1 through C4. Each switch SW is under control of a shift register SR and in the preferred embodiment, the shift register carries a corresponding "0" thereby indicating that the switch is to be in the normal position. For example, shift register SR1 of shift registers 50b is a 0 thereby causing switch SW1 of switches 60b to connect its input to the first output of column C1 to the column write circuitry 30. Switch SW1 normally connects the output line 1 of the column write circuit 30 to column C1. Hence, if the memory array 10 is free of defects either at the point of manufacturing or in the field, the shift registers 50 are loaded with zeroes and the memory array 10 functions normally. In that event, the redundant row/column is not used.

Figure 2:
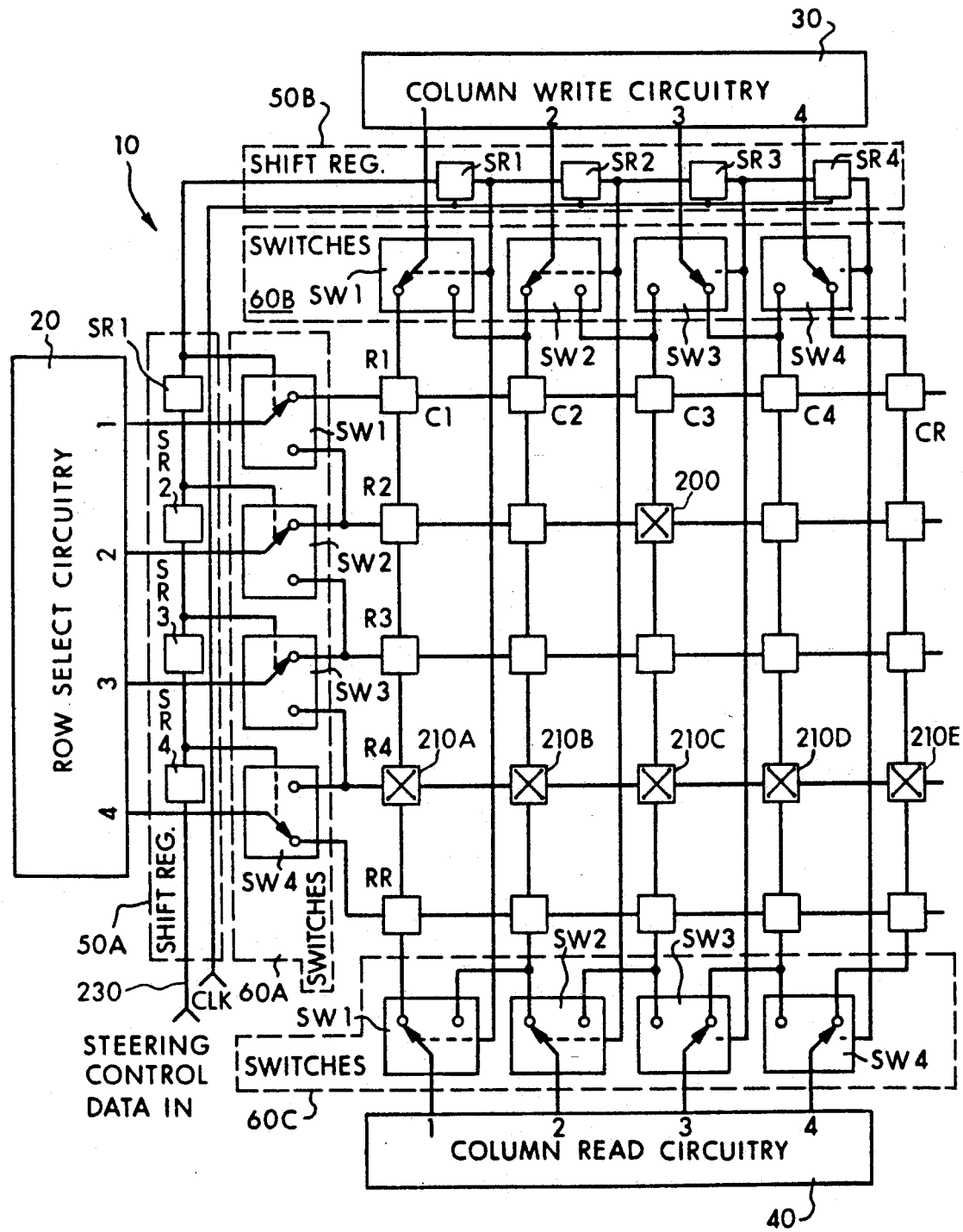
FIG. 2 sets forth the configuration of FIG. 1 having an exemplary defective row and a defective column in which the memory array is configured around the defective row and column in order to utilize the redundant row and column.

FIG. 2 illustrates the presence of defects. For example, defect 200 is a failed memory cell. Defect 210 is a row of defects at row R4 comprising failed memory cells 210A through 210E. Conventional software is available that will thoroughly test the memory array 10 to identify defects 200 and 210. Such conventional memory tests include used checkerboard, walking-ones, and/or walking-zeroes algorithms for thoroughly testing all cells of the memory array.

In order to correct for the presence of defect 200, column C3 is switched out of the memory array 10 by activating switch SW3 in switches 60b to connect its input to the second output which in turn is connected to column C4. This causes output line 3 of the column write circuit 30 to connect to column C4. Likewise, switch SW4 of switches 60b is activated to switch the connection from column 4 over to redundant column CR. In the configuration of FIG. 2, it is clear that the column write circuitry 30 which originally wrote into columns C1, C2, C3, and C4 now by-passes the defective column C3 and writes into columns C1, C2, C4, and CR. The defective column being avoided altogether.

In order to accomplish this, the shift registers 50b change states as follows:

SR1=0

SR2=0

SR3=from 0 to 1

SR4=from 0 to 1

The shift registers 50b also interconnect with the switches 60c to likewise cause switches SW3 and SW4 to activate to the adjacent columns as shown.

The second defect 210 comprises defective cells 210A through 210E for row R4. As shown in FIG. 2, switch SW4 of switches 60A is activated to switch to the adjacent row which in this case is the redundant row RR. Hence, the defective row R4 is switched out of the memory array 10 and the row select 20 output lines 1, 2, 3, and 4, are respectively connected to rows R1, R2, R3, and RR. Again, the states for the shift register change as follows:

SR1=0

SR2=0

SR3=0

SR4=from 0 to 1

As shown in FIG. 2, the defects 200 and 210 are fully removed from the memory array and the memory array 10 is fully functional.

The use of shift registers 50 permit the memory array 10 to be programmed and reconfigured at any convenient time or place. For example, assume that upon manufacture of the memory array 10 defect 210 was detected. At the point of manufacture, the following code would be loaded into the shift registers 50:

Shift Register 50a

SR1=0

SR2=0

SR3=0

SR4=1

Shift Register 50b

SR1=0

SR2=0

SR3=0

SR4=0

This data is sequentially shifted in on line 230 by means of clock pulses CLK which exists on each shift register SR. Hence, in eight clock pulses, the above data would be serially loaded into the shift register as: 10000000. Based upon the serially loaded data, the interconnected switches SW would be placed in the proper state which in this case would activate switch SW4 of 60A to switch out row R4 and interconnect adjacent row RR to row 4 of the row select circuitry 20.

The memory array 10 is then installed in a system such as a computer or an oscilloscope and is sold to an end user. At some time in the future, the end user turns on the system and the memory array 10 is tested for the presence of defects. Defect 200 is detected. The memory array is reprogrammed to be reconfigured. New serial data is loaded into the shift registers 50 to achieve the following states:

Shift Register 50a

SR1=0

SR2=0

SR3=0

SR4=1

Shift Register 50b

SR1=0

SR2=0

SR3=1

SR4=1

The serial data is loaded as: 10000011. When this new code is loaded in, switches S3 and S4 in switches 60b are appropriately set as well as in switches 60c so as to remove column C3 from the array 10, by switching in column CR.

It can be readily appreciated that the present invention can be selectively tested at any time and reprogrammed to avoid the presence of defects in the memory array 10. It is also to be expressly understood that a separate set of shift registers 50 could be located between the column read circuitry 40 and the switches 60c to provide individual shift register control for switches 60c. It is also to be appreciated that rather than using serial shift registers 50, parallel registers could be utilized although this consumes expensive real estate on a semiconductor chip. As can be appreciated, therefore, only two pins corresponding to lead 230 and to the clock need be brought out from the chip in order to load in the data necessary to reconfigure the memory array 10 of the present invention. The clock pulse is also provided to the memory array 10. Finally, it is to be appreciated that each switch SW need not be limited to a two-throw configuration. For example, each switch could be single pole-three throw wherein three outputs could be utilized. This embodiment would allow configuration around two defective rows/columns in a given sector, but would also require two redundant rows/columns to be provided.

In summary, the present invention provides at least one redundant bit line (i.e., a redundant row RR or column CR) aligned along one side of a predetermined number of bit lines (i.e., rows: R1, R2, R3, R4 and/or columns C1, C2, C3, C4). A switch SW is provided to normally (i.e., free of defects) connect the output line (1, 2, 3, 4) of a bit line circuit (i.e., the row select circuit 20, the column write circuit 30, or the column read circuit 40) to an assigned bit line. When an assigned bit line is found to be defective, the shift register controlling the switch having its first output normally connected to the assigned bit line is programmed to change state (such as by providing serial data on line 230). Changing the state in the shift register causes the second output of the switch to connect to the adjacent bit line thereby causing the output line in the bit line circuit to connect to adjacent bit line. Additionally, all of the switches between the defective bit line and the redundant bit line become activated. In other words, a shifting of bit lines occurs from the defective bit line towards the redundant bit line.

Figure 3:
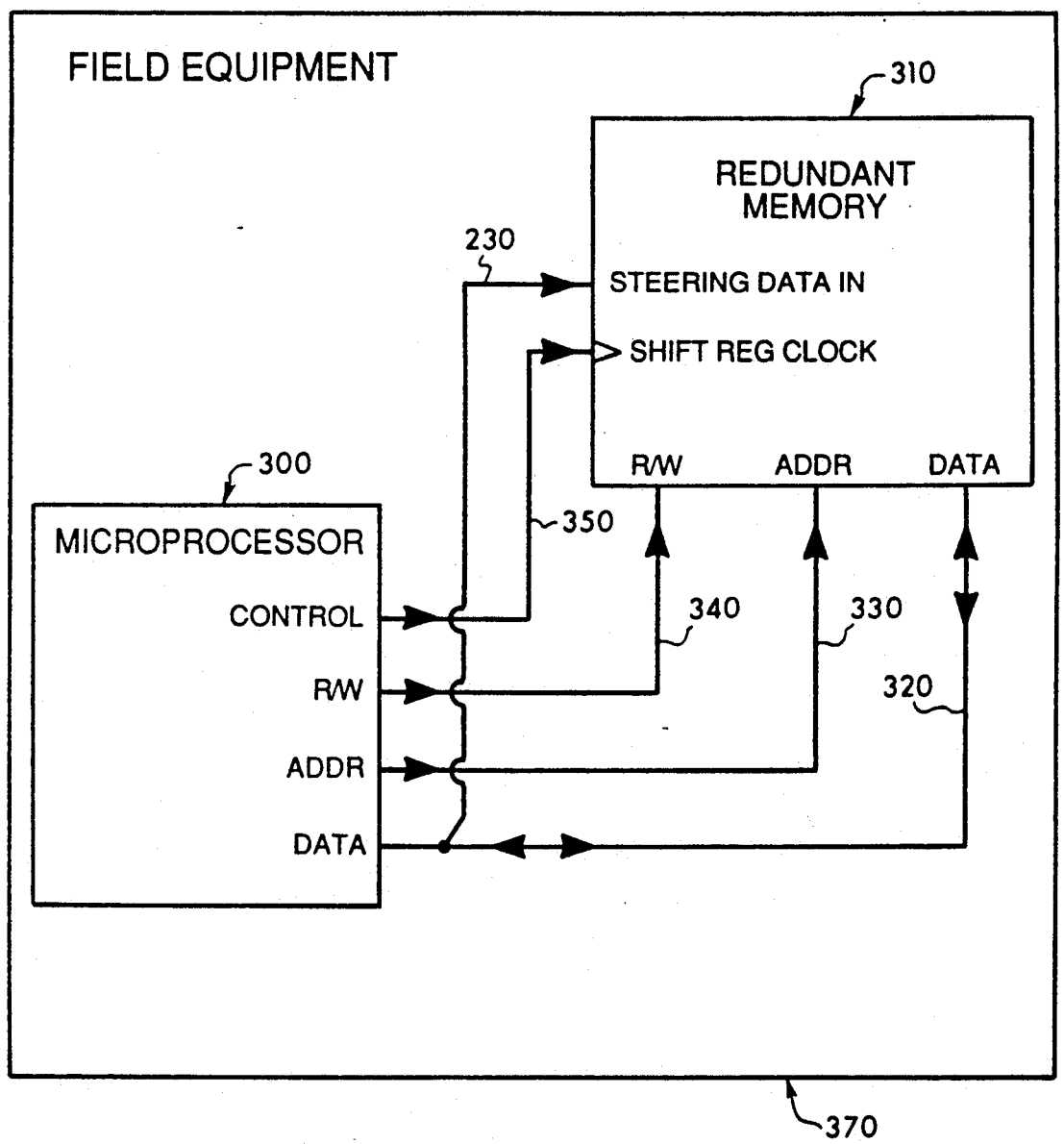
FIG. 3 is a system diagram illustrating the programmability of the row/column redundant circuit of the present invention.

In FIG. 3, the system diagram of the present invention is shown. A microprocessor 300 is interconnected with the redundant memory 310 containing the memory array 10, the row select circuitry 20, the column write circuitry 30, and the column read circuitry 40 and the components of the present invention. The microprocessor 300 is conventionally interconnected to the memory 310 containing the present invention by means of a data bus 320, an address bus 330, a read/write control line 340, and a clock line 350. A portion of the data bus 320a is directed and constitutes the "steering data in" input on line 230. The only addition to the system configuration of FIG. 3, under the teachings of the present invention, is the addition of the steering data in 230 and the utilization of the conventional shift register clock 350. The configuration of FIG. 3 constitutes a typical field environment and operates as shown in FIG. 4.

Figure 4:
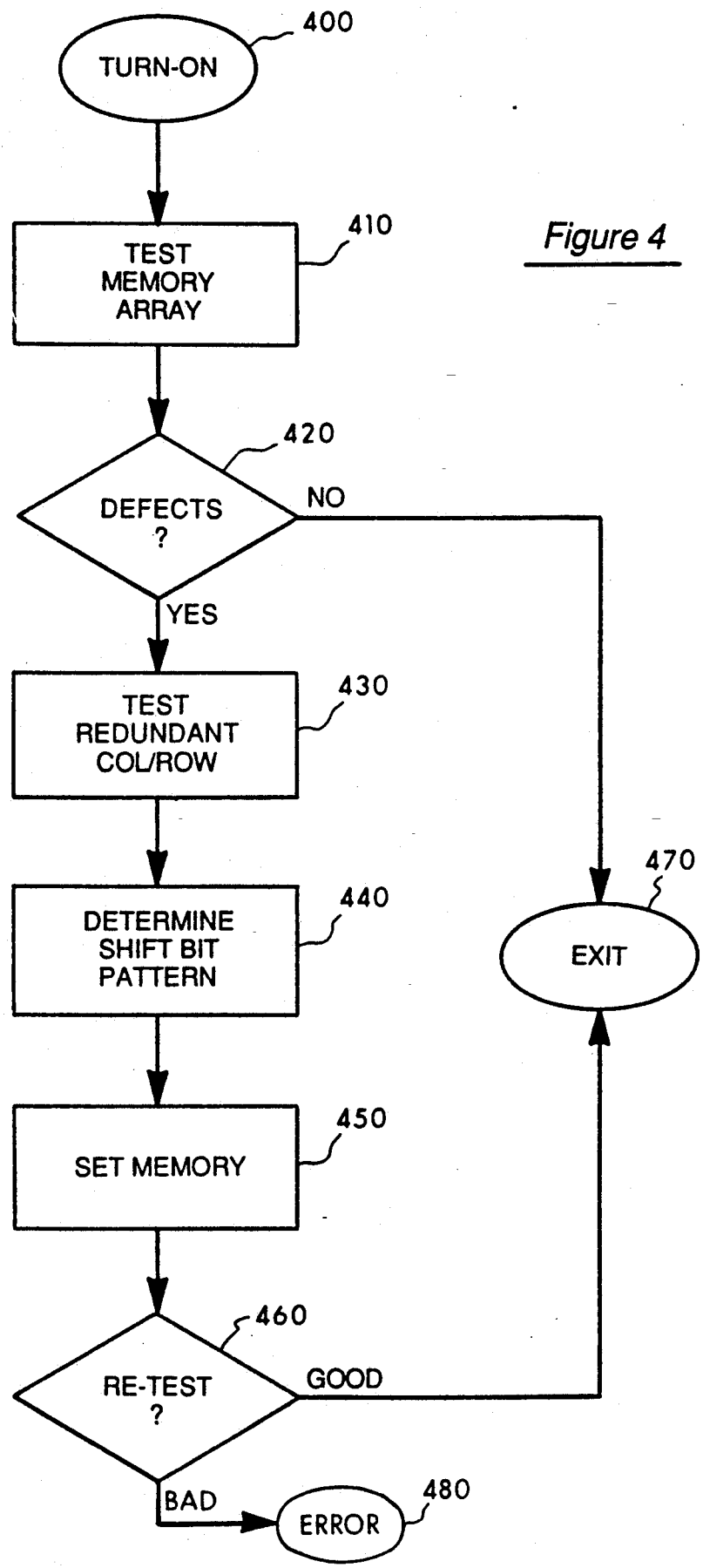
FIG. 4 sets forth a flow chart of operation of the present invention.

In FIG. 4, upon turn-on in stage 400, the microprocessor 300 tests the memory array in step 410 by setting all shift register 50 bits to zero. It is to be expressly understood that the turn-on stage 400 could constitute either a power-up condition or simply activated by the user of the microprocessor 300. Hence, in stage 410, all of the SR bits in the shift registers 50 are set to zero and the normal memory array 10 (i.e., rows: R1 to R4 and columns C1 to C4) is tested for the presence of defects. In the example of FIG. 2, defects 200 and 210 would be detected at this stage. If no defects are detected, exit stage 470 is entered and the memory is good. If, however, defects are detected, stage 430 is entered. In this stage, the microprocessor 300 tests the redundant rows and columns by setting all shift bit registers to one. Based upon the information collected, the microprocessor then enters stage 440 to determine the correct pattern of ones and zeroes for delivery to the shift registers 50 to appropriately switch out defective rows and columns. In stage 450 the memory is set so that the shift registers have the proper code and the memory is retested. The retesting occurs in stage 460. If the test of the memory with the proper shift register bit set indicates the presence of no defects, the exit stage 470 is entered and the memory has been reconfigured and ready for use. On the other hand, if defects are detected an error signal 480 is generated.

It is to be expressly understood that the claimed invention is not to be limited to the description of the preferred embodiment but encompasses other modifications and alterations within the scope and spirit of the inventive concept.

I claim:

1. A system for reconfiguring a memory array, said memory array having a matrix composed of a plurality of columns and a plurality of rows, row select circuitry for selectively accessing said plurality of rows, write circuitry for writing data into selected columns of said plurality of columns, and read circuitry for reading data from selected columns of said plurality of columns, said system further comprising:

- a plurality of redundant columns in said memory array, each one of said plurality of redundant columns being located at a predetermined location in said memory array so as to divide said plurality of columns into equal sectors of columns,
- a plurality of redundant rows in said memory array, each one of said plurality of redundant rows being located at a predetermined location in said memory array so as to divide said plurality of rows into equal sectors of rows,
- means connected to said write and read circuitry for testing said plurality of columns and rows for defects, said testing means generating a reconfiguration row bit pattern when a defective row is identified and a reconfiguration column bit pattern when a defective column is identified,
- a plurality of first switches connected between said row select circuitry and said plurality of rows and plurality of redundant rows, each of said first plurality of switches selectively connecting one of two of said adjacent plurality of rows and plurality of redundant rows to one row said row select circuitry,
- a plurality of second switches connected between said write circuitry and said plurality of columns and plurality of redundant columns, each of said second plurality of switches selectively connecting one of two of said adjacent plurality of columns and plurality of redundant columns to one column of said write circuitry,
- a plurality of third switches connected between said read circuitry and said plurality of columns and plurality of redundant columns, each of said third plurality of switches selectively connecting one of two of said adjacent plurality of columns and plurality of redundant columns to one said column read circuitry,
- first means receptive of said reconfiguration row bit pattern and connected to said first plurality of switches for programmably controlling the selective connection of each said switch to said one of two adjacent rows,
- second means receptive of said reconfiguration column bit pattern and connected to said second and third plurality of switches for programmably controlling the selective connection of each said switch to said one of two adjacent columns.

2. The memory array of claim 1 wherein each of said first, second, and third plurality of switches are solid state switches.

3. The memory array of claim 1 wherein each of said first and second controlling means comprises serial shift registers.

4. A system for reconfiguring a memory array, said memory array having a plurality of columns and a plurality of rows, row select circuitry for selectively accessing said plurality of rows, write circuitry for writing data into selected columns of said plurality of columns, and read circuitry for reading data from selected columns of said plurality of columns, said system further comprising:

- a plurality of redundant columns in said memory array, at least one of said plurality of redundant columns being located at a predetermined location in said memory array so as to divide said plurality of columns into equal sectors of columns,
- a plurality of redundant rows in said memory array, at least one of said plurality of redundant rows being located at a predetermined location in said memory array so as to divide said plurality of rows into equal sectors of rows,
- a plurality of first switches connected between said row select circuitry and said plurality of rows and plurality of redundant rows, each of said first plurality of switches selectively connecting at least one of two of said adjacent plurality of rows and plurality of redundant rows to one row said row select circuitry,
- a plurality of second switches connected between said write circuitry and said plurality of columns and plurality of redundant columns, each of said second plurality of switches selectively connecting at least one of two of said adjacent plurality of columns and plurality of redundant columns to one column of said write circuitry,
- a plurality of third switches connected between said read circuitry and said plurality of columns and plurality of redundant columns, each of said third plurality of switches selectively connecting at least one of two of said adjacent plurality of columns and plurality of redundant columns to one said column read circuitry,
- means connected to said write and read circuitry for testing said plurality of columns and rows for defects, said testing means generating a reconfiguration row bit pattern when a defective row is identified and a reconfiguration column bit pattern when a defective column is identified,
- means receptive of said reconfiguration column and row bit patterns and connected to said first, second and third plurality of switches for programmably controlling the selective connection of each said switch.

5. A memory array reconfiguration system, said system comprising:

- a plurality of bit lines,
- a bit line circuit having a plurality of output lines with each of said output lines assigned to one of said plurality of bit lines,
- a redundant bit line aligned along one side of said plurality of bit lines,
- means for addressing said bit line circuit,
- a plurality of switches, each one of said switches having an input connected to one of said output lines in said bit line circuit and having two switch outputs, the first of said two switch outputs being connected to the bit line corresponding to an assigned output line from said bit line circuit and the remaining one of said two switch outputs connected to an adjacent bit line, the last switch in said plurality of switches having its second switch output connected to said redundant bit line,
- means connected to each of said plurality of switches for selectively controlling the operation of said switches, when any one of said plurality of bit lines is defective, said controlling means causing the switch having its first switch output connected to said defective bit line to connect the input of the aforesaid switch to its second switch output thereby connecting the adjacent bit line to the aforesaid input and disconnecting said defective bit line, said controlling means causing all remaining switches between the aforesaid switch to connect their input to their second switch outputs thereby connecting the corresponding output lines in said bit line circuit to the adjacent bit lines with the redundant bit line being connected to the last output line of said bit line circuit, means for testing said bit line circuit for defective bit lines by addressing said addressing means with test information, said testing means delivering reconfiguration information to said controlling means for controlling the operation of each of said plurality of switches when defective bit lines are present.

6. The memory array of claim 5 wherein said switches are solid state switches.

7. The memory array of claim 5 wherein said controlling means comprises serial shift registers.

8. A memory array reconfiguration system, said system comprising:

a plurality of bit lines, a bit line circuit having a plurality of output lines with each of said output lines assigned to one of said plurality of bit lines, at least one redundant bit line aligned along one side of said plurality of bit lines, means for addressing said bit line circuit, a plurality of switches, each one of said switches having an input connected to one of said output lines in said bit line circuit and having at least two switch outputs, the first of said at least two switch outputs connected to a bit line corresponding to the assigned output line from said bit line circuit and the remaining switch outputs connected to the adjacent bit lines, the last switch in said plurality of switches having its second switch output connected to the last of said at least one redundant bit line, means connected to each of said plurality of switches for selectively controlling the operation of said switches, when any one of said plurality of bit lines is defective, said controlling means causing the switch having its first switch output connected to said defective bit line to connect the input of the aforesaid switch to its at least one remaining switch output thereby connecting the adjacent bit line to the aforesaid output line of said bit line circuit and disconnecting said defective bit line, said controlling means causing all remaining switches between the aforesaid switch to connect their input to their at least one remaining switch output thereby connecting the corresponding output lines in said bit line circuit to the adjacent bit line with the at least one redundant bit line being connected to the last at least one output line of said bit line circuit, means for testing said bit line circuit for defective bit lines by addressing said addressing means with test information, said testing means delivering reconfiguration information to said controlling means for controlling the operation of each of said plurality of switches when defective bit lines are present.

9. A method of reconfiguring a memory array in field equipment, said field equipment containing a microprocessor operative with said memory array, said method comprising the steps of:

providing a plurality of bit lines and a plurality of redundant bit lines in the memory array, providing a program having test data in the microprocessor, periodically testing the memory array for defects by having the microprocessor write test data from the program into the memory array and read data from the memory array, identifying in the microprocessor the presence of any defective bit lines in said plurality of bit lines during the periodic test in response to the reading of the data from the memory array, determining in the microprocessor a reconfiguration pattern for the plurality of bit lines and the plurality of redundant bit lines in response to the step of identification, using the microprocessor to (i) switch out all defective bit lines from the tested memory array and to (ii) reconfigure the memory array around remaining good and redundant bit lines in response to the reconfiguration pattern.

10. The method of claim 9 wherein the periodic testing occurs each time the field equipment is turned on.

11. A method of reconfiguring a memory array in field equipment, said field equipment containing a microprocessor operative with said memory array, said method comprising the steps of:

providing a plurality of bit lines and a plurality of redundant bit lines in the memory array, providing a program having test data in the microprocessor, periodically testing the memory array by having the microprocessor write test data into the memory array and read data from the memory array, receiving in the microprocessor the data read from the memory array, identifying in the microprocessor the presence of any defective bit lines in said plurality of bit lines based upon said read data, if defects are present in the read data, identifying the presence of any defective bit lines in the plurality of bit lines, determining in the microprocessor a reconfiguration pattern for the plurality of bit lines and the plurality of redundant bit lines, based upon the reconfiguration pattern in the aforesaid step, switching out all defective bit lines from the tested memory array and reconfiguring the memory array around remaining good and redundant bit lines.

* * * * *